(12) United States Patent
Le Roy et al.

(10) Patent No.: US 7,697,146 B2
(45) Date of Patent: *Apr. 13, 2010

(54) APPARATUS AND METHOD FOR OPTICAL INTERFERENCE FRINGE BASED INTEGRATED CIRCUIT PROCESSING

(75) Inventors: Erwan Le Roy, Newark, CA (US); Chun-Cheng Tsao, Cupertino, CA (US); Theodore R. Lundquist, Milpitas, CA (US)

(73) Assignee: DCG Systems, Inc., Fremont, CA (US)

( * ) Notice: Subject to any disclaimer, the term of this patent is extended or adjusted under 35 U.S.C. 154(b) by 999 days.

This patent is subject to a terminal disclaimer.

(21) Appl. No.: 11/362,240

(22) Filed: Feb. 24, 2006

(65) Prior Publication Data

US 2006/0188797 A1  Aug. 24, 2006

Related U.S. Application Data

(60) Provisional application No. 60/656,557, filed on Feb. 24, 2005.

(51) Int. Cl.
G01B 11/02 (2006.01)
(52) U.S. Cl. .................................................. 356/497
(58) Field of Classification Search ................. 356/479, 356/497
See application file for complete search history.

(56) References Cited

U.S. PATENT DOCUMENTS 5,298,365 A * 3/1994 Okamoto et al. ............. 430/311
5,612,535 A * 3/1997 Wang .......................... 250/310
5,900,937 A * 5/1999 Wang .......................... 356/511
6,955,930 B2 10/2005 Le Roy et al.
6,958,248 B1 10/2005 Le Roy et al.
2006/0188797 A1 * 8/2006 Roy et al. ...................... 430/30
2006/0244974 A1 * 11/2006 Pfaff ........................... 356/517
2007/0293052 A1 * 12/2007 Le Roy et al. ................ 438/708

* cited by examiner

*Primary Examiner*—Patrick J Connolly
(74) *Attorney, Agent, or Firm*—Nixon Peabody LLP.; Joseph Bach

(57) ABSTRACT

An apparatus and method for processing an integrated circuit employing optical interference fringes. During processing, light is directed on the integrated circuit and based upon the detection of interference fringes, further processing may be controlled. One implementation involves charged particle beam processing of an integrated circuit as function of detection of interference fringes. A charged particle beam trench milling operation is performed in or on the substrate of an integrated circuit. Light is directed on the floor of the trench. When the floor approaches the underlying circuit structures, some light is reflected from the floor of the trench and some light penetrates the substrate and is reflected off the underlying circuit structures. Interference fringes may be formed from the constructive or destructive interference between the light reflected from the floor and the light from the circuit structures. Processing may be controlled as function of the detection of interference fringes.

26 Claims, 14 Drawing Sheets

APPARATUS AND METHOD FOR OPTICAL INTERFERENCE FRINGE BASED INTEGRATED CIRCUIT PROCESSING

CROSS-REFERENCE TO RELATED APPLICATIONS

The present application is a non-provisional application claiming priority to provisional application No. 60/656,557 titled "Apparatus and Method for Optical Interference Fringe Based Charged Particle Beam Endpointing," filed on Feb. 24, 2005, which is hereby incorporated by reference herein.

FIELD OF THE INVENTION

Aspects of the present invention generally involve the field of integrated circuit processing, and more particularly involves optical interference fringe based integrated circuit processing, which may involve charged particle beam processing of an integrated circuit.

BACKGROUND

A newly-designed integrated circuit ("IC") is typically fabricated over a process of several weeks, involving preparation of silicon substrate wafers, generation of masks, doping of the silicon substrate, deposition of metal layers, and so on. The IC typically has various individual electronic components, such as resistors, capacitors, diodes, and transistors. The metal layers, which may be aluminum, copper, or other conductive material, provide the interconnection mesh between the various individual electronic components to form integrated electrical circuits. Vias formed of electrically conductive material often provide communication pathways between various metal layers. Contacts provide communication links between metal layer and individual electronic components.

Unfortunately, a new IC of any complexity rarely works as expected when first fabricated. Normally, some defects in the operation of the IC are discovered during testing. Also, some functions of the IC may operate properly under limited conditions, but fail when operated across a full range of temperature and voltage in which the IC is expected to perform. Once the IC has been tested, the designer may change the design, initiate the manufacture of a second prototype IC via the lengthy process described above, and then test the new IC once again. However, no guarantee exists that the design changes will correct the problems previously encountered, or that all of the problems in the previous version of the IC have been discovered.

Charged particle beam systems, such as focused ion beam ("FIB") systems, have found many applications in various areas of science and industry. Particularly in the semiconductor industry, FIB systems are used for integrated circuit probe point creation, failure analysis, and numerous other applications. Moreover, FIB systems may be used to edit a circuit ("circuit editing") to test design charges and thereby avoid some or all of the expense and time of testing design changes through fabrication. A FIB tool typically includes a particle beam production column designed to focus an ion beam onto the IC at the place intended for the desired intervention. Such a column typically comprises a source of ions, such as Ga+ (Gallium), produced from liquid metal. The Ga+ is used to form the ion beam, which is focused on the IC by a focusing device comprising a certain number of electrodes operating at determined potentials so as to form an electrostatic lens system. Other types of charged particle beam systems deploy other arrangements to produce charged particle beams having a desired degree of focus.

As mentioned above, IC manufacturers sometimes employ a FIB system to edit the prototype IC, thereby altering the connections and other electronic structures of the IC. Circuit editing involves employing an ion beam to remove and deposit material in an IC with precision. Removal of material, or milling, may be achieved through a process sometimes referred to as ion sputtering. Addition or deposition of material, such as a conductor, may be achieved through a process sometimes referred to as ion-induced deposition. Removal and deposition are typically performed in the presence of gas, such as $XeF_2$ for removal and platinum or tungsten organo-metallic precursor gases for deposition. Through removal and deposit of material, electrical connections may be severed or added, which allows designers to implement and test design modifications without repeating the wafer fabrication process.

Due to the increasing density of metal interconnections and number of metal layers, FIB based circuit editing through the topside of an IC is increasingly difficult. It is often the case that FIB milling to define access holes to reach a deep metal layer in the semiconductor structure would damage or destroy other structures or layers along the way. To avoid this, increasingly, FIB circuit editing is performed through the backside silicon substrate of the chip.

Conventionally, to access a target IC structure, a trench or hole is milled through the backside silicon substrate with the FIB beam in a raster pattern. Rastering the FIB beam occurs over anywhere from a 100 micrometer ($\mu m$)×100 $\mu m$ square to 350 $\mu m$×350 $\mu m$ square. However, with increasingly more dense device IC geometries, such sized FIB holes can affect the heat dissipation characteristics of the substrate. Moreover, the present inventors have recognized that a smaller raster pattern and hence a smaller trench can be completed more quickly, which decreases the time required for testing.

One particular problem with milling smaller trenches arises in determining when to stop a milling a procedure, often referred to as "endpointing." Optimally, the trench is milled so that the floor of the trench (the amount of silicon remaining between the trench and the underlying integrated circuit structures) is the proper thickness for subsequent operations. With larger trenches, such as those exceeding 100 micrometer ("$\mu m$")×100 $\mu m$, existing techniques, such as the voltage contrast technique discussed in U.S. Pat. No. 6,958, 248 titled "Method and apparatus for the improvement of material/voltage contrast," by Le Roy et al, which is hereby incorporated by reference herein, work well. However, as trench sizes are reduced, existing endpointing techniques are sometimes insufficient or do not work at all, and result in either a trench that is too deep or too shallow. In such cases, the target structure may be destroyed or the target structure insufficiently exposed for subsequent endpointing techniques, circuit editing operations, imaging, etc.

Another endpointing procedure employs a technique referred to as optical beam-induced current ("OBIC") analysis. OBIC involves directing a laser on a junction area within a trench. The laser creates a current flow in the junction area. The magnitude of the current flow is a function of the amount of remaining silicon of the trench floor. OBIC works well when the number of junctions in the illumination area are well known, the silicon thickness versus current relationship is well characterized, and the beam can be controlled in order to illuminate a known number of junctions. As device geometry continually shrinks, the number of junctions in an area and the ability to illuminate known numbers of junctions becomes increasingly difficult, making OBIC more difficult to calibrate and use accurately for endpointing.

Thus, the efficiency and potential of charged particle beam, as well as other circuit editing and integrated circuit processing techniques are limited by the difficulty in determining when to stop a milling procedure and more generally the ability to control integrated circuit processing operations as the geometry of the working area continues to decrease.

SUMMARY

Aspects of the present invention may involve a method and apparatus for processing an integrated circuit involving the operation of directing white light on some portion of the integrated circuit. The method further involves receiving reflected light from the portion of the integrated circuit. The white light may reflect from the surface as well as penetrate the surface and reflect from an underlying surface. Thus, the method further involves detecting interference fringes formed from the reflected light. Processing of the integrated circuit may then proceed in response to the interference fringes.

Aspects of the present invention may also involve a method and apparatus for conducting a charged particle beam operation on an integrated circuit. The method may involve directing a charged particle beam on a target region of an integrated circuit and directing light on the target region of the integrated circuit. The light may reflect from the surface as well as penetrate the surface and reflect from an underlying surface. Thus, the method further involves receiving reflected light from the target region of the integrated circuit. Control of the charged particle beam may then proceed as a function of the detection of interference fringes from the reflected light.

DETAILED DESCRIPTION OF EMBODIMENTS OF THE INVENTION

Aspects of the present invention involve processing an integrated circuit, whether on a wafer, separated from the wafer, or in other forms, through generation of and characteristics of interference fringes. When processing an integrated circuit, which may involve mechanical milling, lapping, laser etching, chemical etching, polishing, charged particle beam processing, etc., light is directed on the integrated circuit to cause light to reflect from various features of the integrated circuit causing the interference fringe effect. Control of subsequent processing operations is a function of the detection or and/or characteristic of the interference fringes detected.

Generally, interference fringes are a function of light reflecting off of two closely spaced surfaces. In an everyday example, a person can witness an interference fringe effect in the rainbow like appearance from light reflecting from oil floating on water. Some of the light reflects off of the oil, and some light propagates through the oil and reflects off the underlying water. The light waves reflecting from the oil and water can constructively or destructively interact to cause the colorful bands in many patterns.

Figure 1:
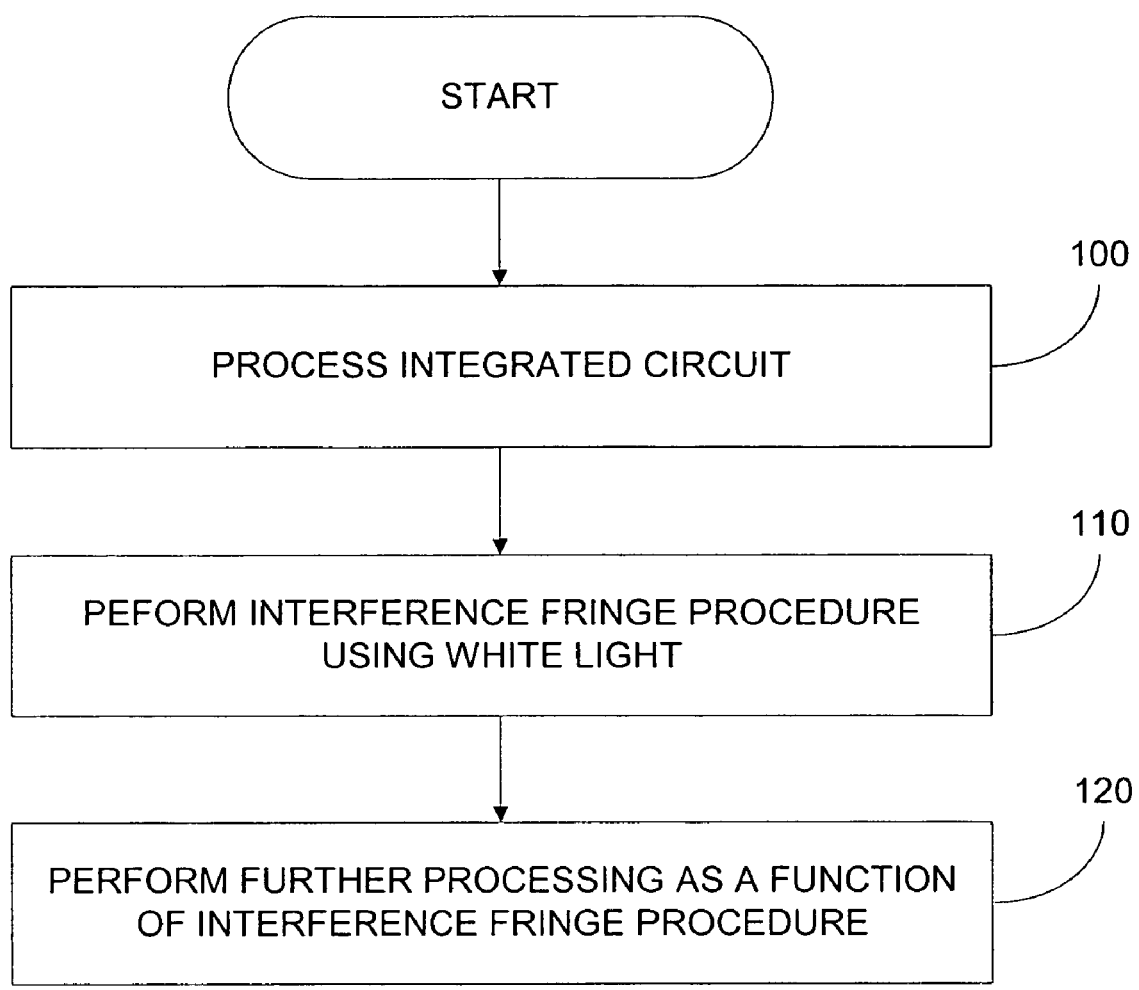
FIG. 1 is a flowchart illustrating one method of optical interference fringe processing of an integrated circuit, in accordance with aspects of the present invention.

Referring first to FIG. 1, in accordance with aspects of the present invention, some form of integrated circuit processing is undertaken (operation 100). As mentioned above, various forms of integrated circuit processing may be undertaken, including but not limited to, charged particle beam processing (e.g., FIB, electron beam, etc.), mechanical milling, which may involve only a portion of the substrate or the entire surface, lapping, laser etch, and chemical etch. The IC may be processed in order to test, characterize, or view some or all of the IC, or it may be processed for other reasons such as thinning silicon for smart cards, stacked die, as well as others. During the procedure, whether continuously, at discrete intervals, while the procedure is being undertaken or at breaks in the procedure, light is directed on a portion of the integrated circuit being processed in order to generate interference fringes (operation 110). The light may be filament bulb light, laser light, light emitting diode light, and in various wavelengths, depending on the surface being processed, structures within the integrated circuit, and other factors that may effect the light propagation through the surface and reflection both from the surface and underlying structures, as well as other factors. In one example, interference fringes are formed from the constructive or destructive interference of light reflecting from the surface and light reflecting from some structure, surface, boundary, etc., of the integrated circuit below the surface. Further processing of the integrated circuit is performed as a function of the interference fringe procedure (operation 120). The characteristics of the fringes, brightness, spacing, pattern, presence, absence, etc., will depend on the surface and the underlying structure and the wavelength of light; thus, because the wavelength is known, the characteristics of the fringes will provide information about both the surface being processed as well as the underlying structures, surfaces, etc.

One more particular aspect of the present invention involves an apparatus and method for determining when to stop milling, charged particle beam processing, lapping or other form of integrated circuit substrate or other feature removal procedure based upon the generation and detection of optical interference fringes. During charged particle beam, mechanical, or other type of milling procedure, light is guided into a trench formed by the charged particle tool. In this example, a trench is formed through the backside integrated circuit substrate; however, it is also possible to process the front-side of the integrated circuit. Rastering the charged particle beam is commonly employed to form a trench. Prior to milling a trench, the substrate may be polished to a reduced thickness, such as 10 μm to 50 μm. Typically, at the start of the milling procedure, with perhaps a silicon substrate that is 10 or more micrometers thick, no interference fringes are detected when light is directed on the trench floor. However, with implementations set forth herein, it is possible to polish or lap the substrate to a thinner dimension than currently available such that interference fringes would be detected. Thus, it is possible to employ techniques set forth herein in a polishing or lapping environment.

As the trench is milled deeper into the substrate and gets closer to various circuit structures formed in and on the substrate, light directed on the trench will generate interference fringes which can be detected using a filter, such as a 500 nm filter with a 70 nm bandwidth, and used to determine when to stop a milling procedure, in conformance with aspects of the present invention.

Figure 2:
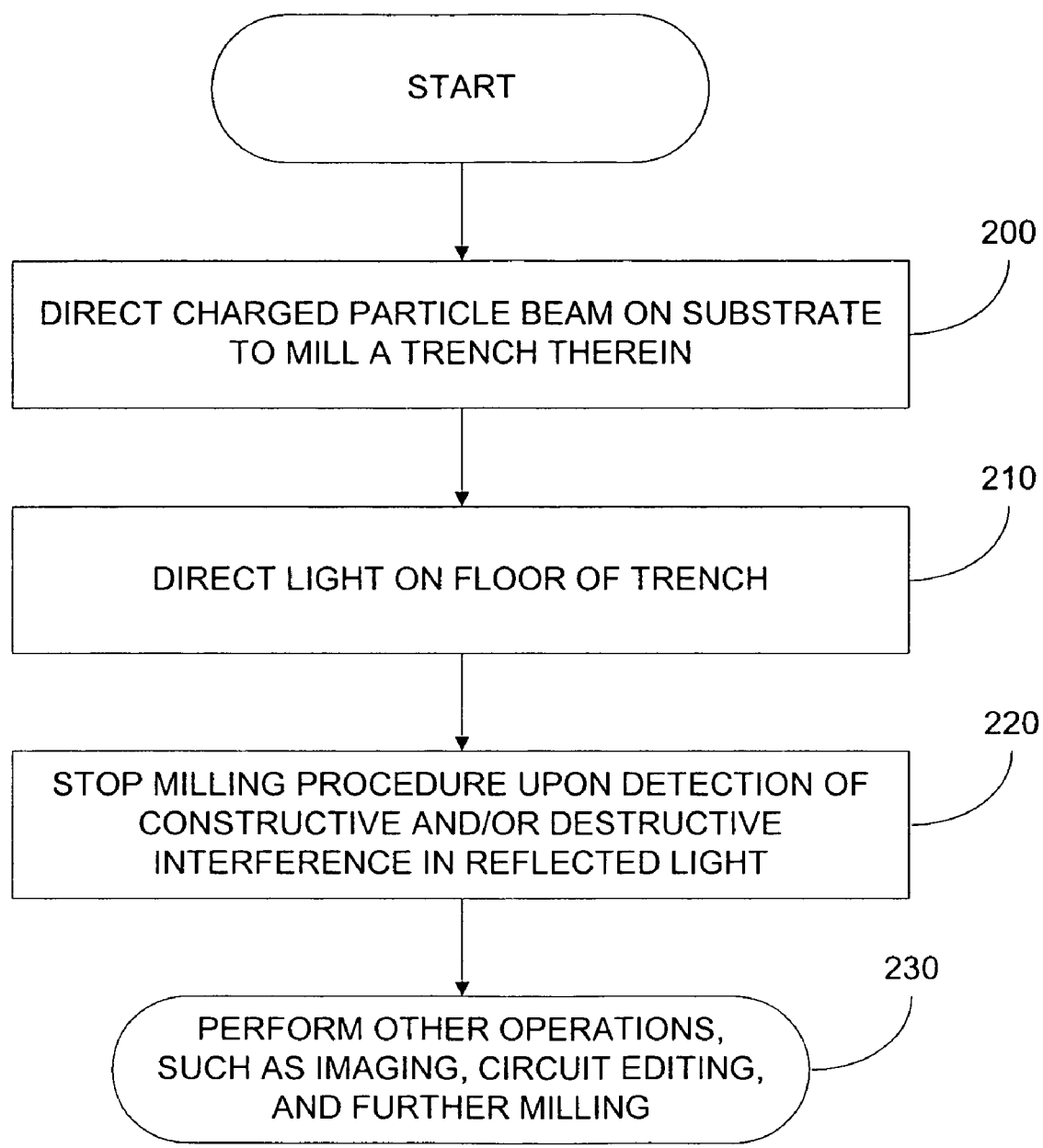
FIG. 2 is a flowchart illustrating one method for charged particle beam endpointing through generation and detection of optical interference fringes, in accordance with aspects of the present invention.

Referring now to FIG. 2, in accordance with one particular aspect of the present invention, a charged particle beam, such as a FIB, is directed on a substrate, or other portion of an integrated circuit to mill a trench (operation 200). Trenches are formed to access circuit structures in order to probe the circuit to detect signals, to make a connection, to break a connection, etc. During the milling operation, light is propagated on the trench floor (operation 210), which reflects off of the bottom of the trench. Initially, in the formation of the trench when the separation between the trench floor and underlying structures is relatively large, it is possible that no fringes will be detected. As the depth of the trench increases and hence the trench floor approaches the circuit structures, some light propagates through the silicon and reflects off of the underlying circuit structures. The interaction of the light reflecting from the bottom of the trench and the light reflecting from underlying circuit structures causes constructive and/or destructive interference between the reflected light. As such, upon detection of, or at some time thereafter, interference fringes, a charged particle beam milling operation can be stopped (operation 220). Once the trench is properly formed, other operations may be conducted, such as imaging, circuit editing, and additional milling (operation 230).

One advantage of a white light source over other light sources is that it covers the visible to infrared spectra. Thus, a white light source in conjunction with bandpass filtering allows for a wide possible spectral range. While possible to employ LED or laser, LED has a much narrower spectral range, about 20-50 nm, and laser is a single wavelength.

Figure 3:
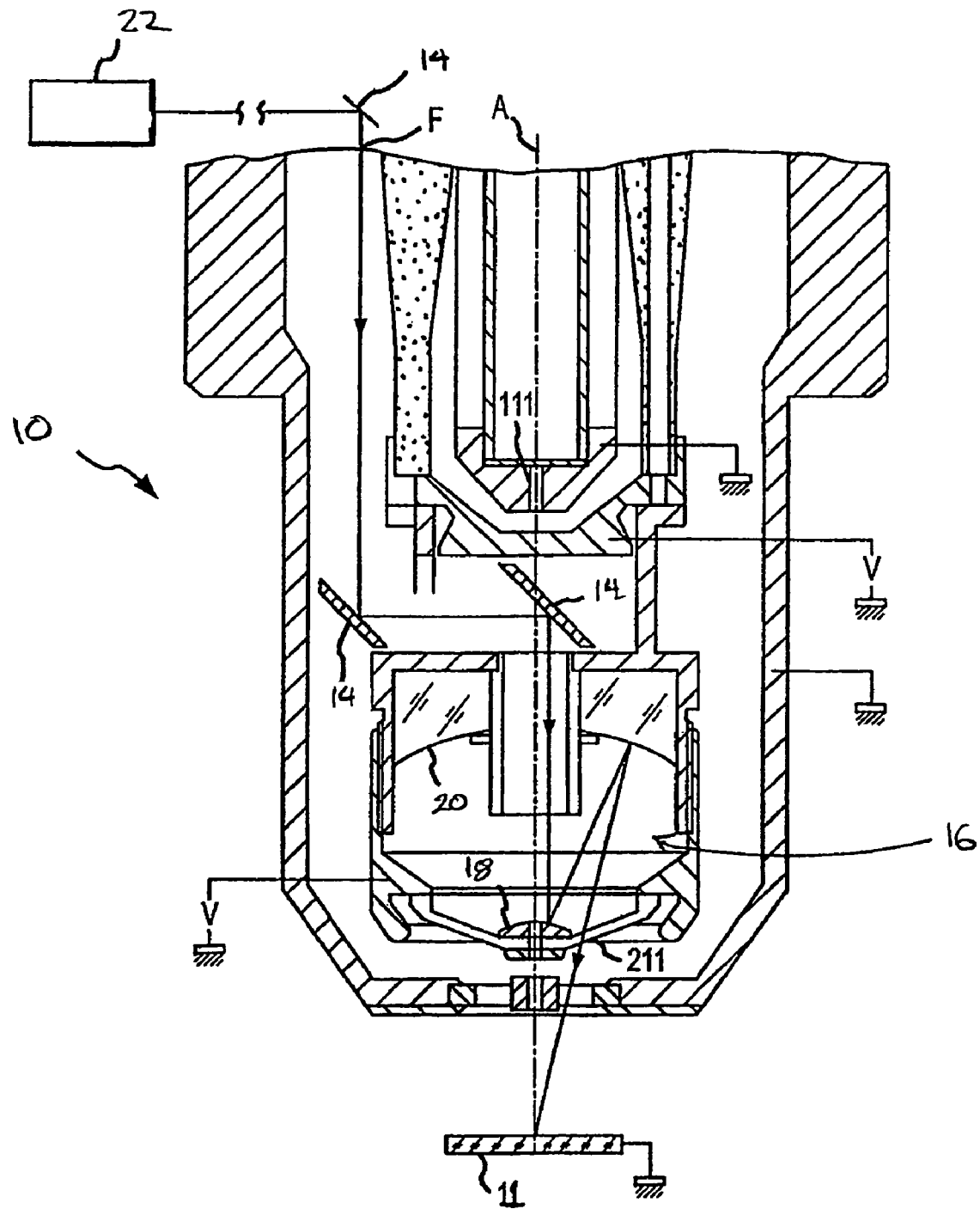
FIG. 3 is a section view of a focused ion beam tool having a focused ion beam structure and optical structure for generation and detection of optical interference fringes, in accordance with aspects of the present invention.
Figure 4:
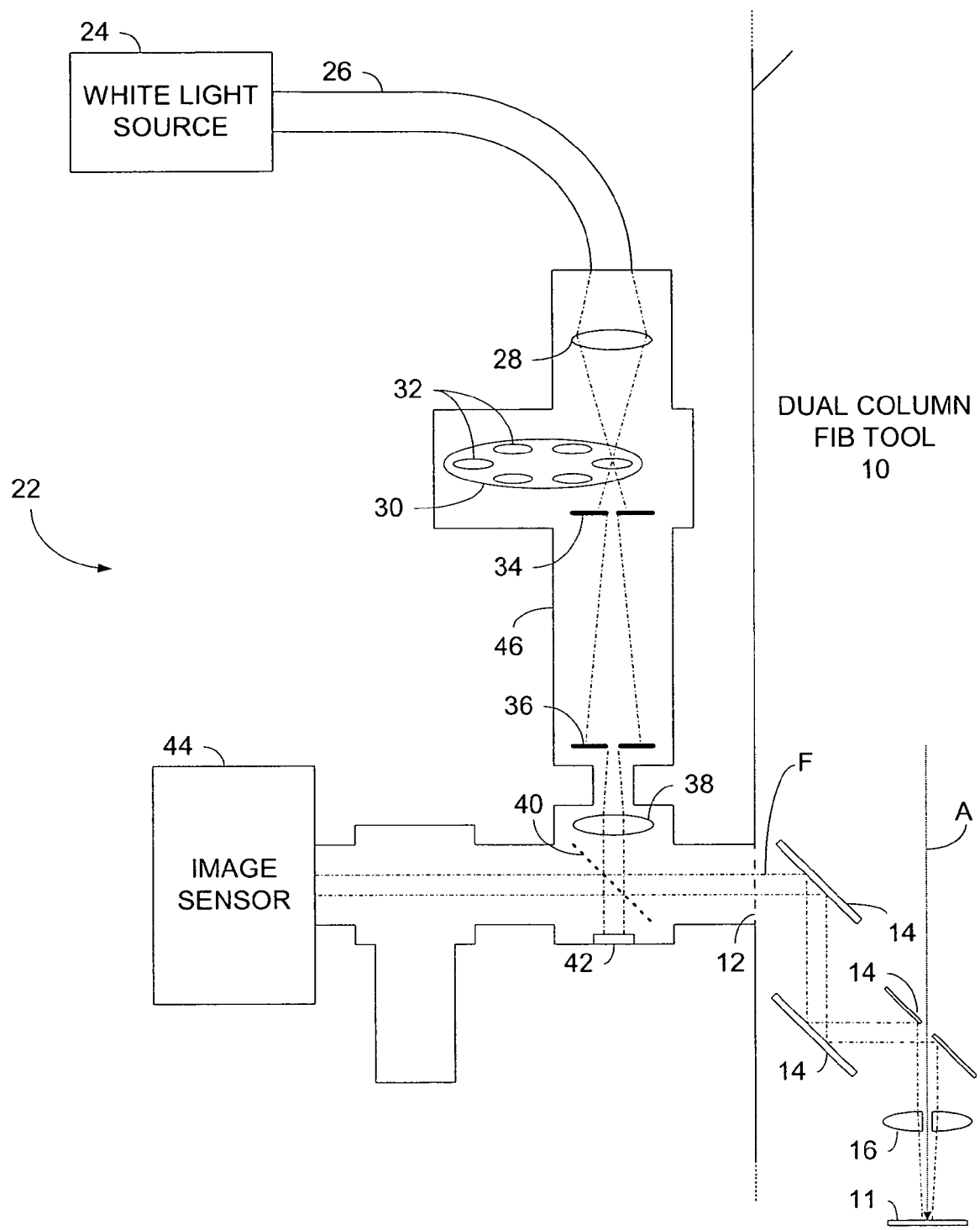
FIG. 4 is a schematic diagram of the focused ion beam tool of FIG. 3, emphasizing the optical structure for generation and detection of optical interference fringes.

FIG. 3 is a section view of a FIB tool 10 having an ion beam path A and an optical path F. FIG. 4 is a schematic diagram of an optical assembly and a portion of the focused ion beam tool. Various implementations of the invention are discussed herein with reference to focused ion beam type charged particles tools; however, other charged particle tools, such as electron beam (e-beam) and the like may also be adapted to conform to aspects of the present invention. Moreover, other integrated circuit processing tools such as laser beam, plasma beam, milling tools, grinding tools, chemical mechanical polishing tools, and the like may be configured in accordance with aspects of the present invention.

The FIB tool is configured to perform interference fringe generation and detection, in accordance with aspects of the present invention. The ion beam path A is adapted to direct an ion beam to an IC 11 for purposes of circuit editing, milling, secondary electron imaging, etc. The optical path F directs light to and from the IC for illumination and imaging purposes. Additionally, the optical path directs light to and from the target portion of an IC to perform optical interference based endpointing and other interference fringe processing in accordance with various aspects of the present invention. One such FIB tool that may be configured in accordance with aspects of the present invention is shown and described in U.S. patent application Ser. No. 10/239,293 (Publication No. US2003/0102436) titled "Column Simultaneously Focusing a Particle Beam and an Optical Beam" filed on Mar. 19, 2001, which is hereby incorporated by reference herein. The FIB tool set forth in the '293 application includes integrated optics; however, it is possible to employ a FIB tool that does not include integrated optics. U.S. patent application Ser. No. 11/222,932 titled "Optical Coupling Apparatus for a Dual Column Charged Particle Beam Tool for Imaging and Forming Silicide in a Localized Manner," filed Sep. 8, 2005, describes various focused ion beam arrangements with light provision arrangements that may be configured to perform various aspects of the methods set forth herein.

Within the column of the FIB tool, a series of mirrors direct light between an optical port 12 located along a side of the column and an objective lens arrangement located at the distal end of the optical path. The optical path includes mirrors 14 and the objective lens 16. In one example, the objective lens includes a convex mirror 18, and a concave mirror 20 adapted to convey and focus an optical beam to and from the IC 11. The optical path shown in FIGS. 3 and 4 is but one possible path, and other optical configurations are possible. For purposes of imaging and interference endpointing, the objective lens is arranged to focus light on the target IC and receive reflected light from the target IC.

An optical assembly 22 is coupled with the optical port. The optical assembly is adapted to couple light with the optical path F, and to image reflected light received from the target IC. The light received from the target IC will display interference fringes when the floor of a trench being milled approaches the underlying circuit structures.

Referring to FIG. 3, the optical assembly 22 includes a "flood" illumination and imaging configuration for detection of interference fringes in order to determine when to stop a milling/trenching operation. The optical coupling apparatus includes a white light source 24, which may be, for example, a xenon (Xe) or halogen lamp, optically coupled by way of a fiber bundle 26 to a condenser lens 28. It is also possible to employ a light emitting diode, laser, or other light source. The fiber bundle 26 provides an optical conduit by which substantially all of the light emitted by the white light source 24 is transmitted to the condenser lens 28. The condenser lens 28 converges the light received from the fiber bundle 26 onto a selectable optical bandpass filter 30, which allows passage of a portion of the frequency spectrum of the light. In one example, the optical bandpass filter 30 takes the form of a filter wheel, about which one or more filter windows 32 are provided, with each window 32 allowing the passage of a different portion of the spectrum exhibited by the light beam. To select a particular window, the filter wheel 30 is rotated so that the desired window 32 lies within the light beam from the condenser lens 28. For imaging, the selectable nature of the optical filter wheel 30 allows the use of diverse light wavelengths in an effort to provide high contrast images of the various features of the IC 11 being imaged. In alternative embodiments, the optical bandpass filter may not be selectable, thus permitting a predetermined portion of the frequency bandwidth to pass therethrough. For interference fringe generation/detection, in one implementation, bandpass filters are included in the filter wheel 30 to pass various wavelengths of light particularly suited to cause interference fringes from the silicon/circuit boundary region. In one particular implementation, a filter adapted to pass 500 nanometer (nm) wavelength light is employed. 500 nm mediumband or narrowband bandpass filters may be employed in embodiments of the present invention.

After the light beam from the condenser lens 28 has passed through the selectable optical bandpass filter 30, an aperture stop 34 controls the size of the beam. Generally, a stop is an aperture residing within an opaque screen. Typically, the aperture stop 34 is embodied as an adjustable iris mechanism which provides an aperture of a user-selectable diameter through which the beam passes. The aperture stop 34 thus adjustably limits the angle of rays diverging from the optical bandpass filter 30, thus limiting the size and brightness of the beam. Brightness control aids in imaging a variety of IC structures and surfaces, each possessing its own reflectivity characteristics.

After exiting the aperture stop 34, the light beam encounters a field stop 36. In one embodiment, the field stop 36, similar in structure to the aperture stop 34 described above, provides an iris of adjustable diameter. As a result, the field stop 36 provides a mechanism which controls the size of the resulting image of the IC and the area being lit for interference purposes by controlling the amount of IC area being illuminated. Alternatively, the field stop 36 can be fixed.

Upon exiting the field stop 36, the light beam encounters a field lens 38, which collimates the diverging light from the aperture stop 34 and the field stop 36, thus yielding a collimated illumination beam whose individual rays are substantially directed parallel to each other. The collimated illumination beam then encounters a beam splitter 40. The beam splitter 40 is adapted to direct a significant portion of the collimated illumination beam (for example, 50%) through the port 12 of the FIB tool 10, after which the beam is directed along the optical path F toward the IC, such as by way of the one or more mirrors 14, and the objective lens 16. That portion of the collimated illumination beam not directed by the first beam splitter 40 toward the port 12 of the dual column tool 16 passes through the first beam splitter 40 and impinges a beam trap 42, which substantially prohibits reflection of that portion of the collimated illumination beam toward any other portion of the optical path of the optical coupling apparatus 22.

A portion of the illumination beam incident upon the IC is reflected from the IC 11. While milling the trench with the FIB beam, the resulting reflected light may be characterized as an endpointing beam. After the endpoint is detected and milling is complete, the resulting reflected light may be characterized as an imaging beam, which imparts information concerning structural and compositional features of the IC 11 illuminated by the illumination beam. Both the endpointing and imaging beam are in many ways the same. However, for purposes of this application, the endpointing beam is processed or used to operate and detect interference fringes whereas the imaging beam is processed or used to view the structure of the IC exposed in the trench. Further, as discussed in more detail below, the image can be used to align the FIB for further pinpoint milling, deposition, and the like. The endpointing and imaging beams reflected from the IC are directed by the objective lens 16 toward the one or more mirrors 14, which direct the imaging beam toward the port 12.

Upon exit from the FIB tool 10, the endpointing and imaging beam encounter the first beam splitter 40, which is configured to allow about 50% of the endpointing and imaging beams to pass therethrough. The endpointing or imaging beam are then accepted by an image sensor 44, such as a charge-coupled device (CCD) camera, which produces an electronic image of the illuminated portion of the trench or IC from the endpointing or imaging beams, respectively. Interference fringes may be seen in the image by the user as concentric rings of differing contrast or color, as waves or shimmers of differing contrast or color, or other manifestation of the interference fringes. Before the appearance of fringes, the image is typically a fairly uniform grey. As the trench is milled in the silicon substrate and gets closer to the underlying circuit structure, constructive and destructive interference typically occurs, causing the visible, albeit possibly faint, appearances of interference fringes in the image of the trench.

Figure 5:
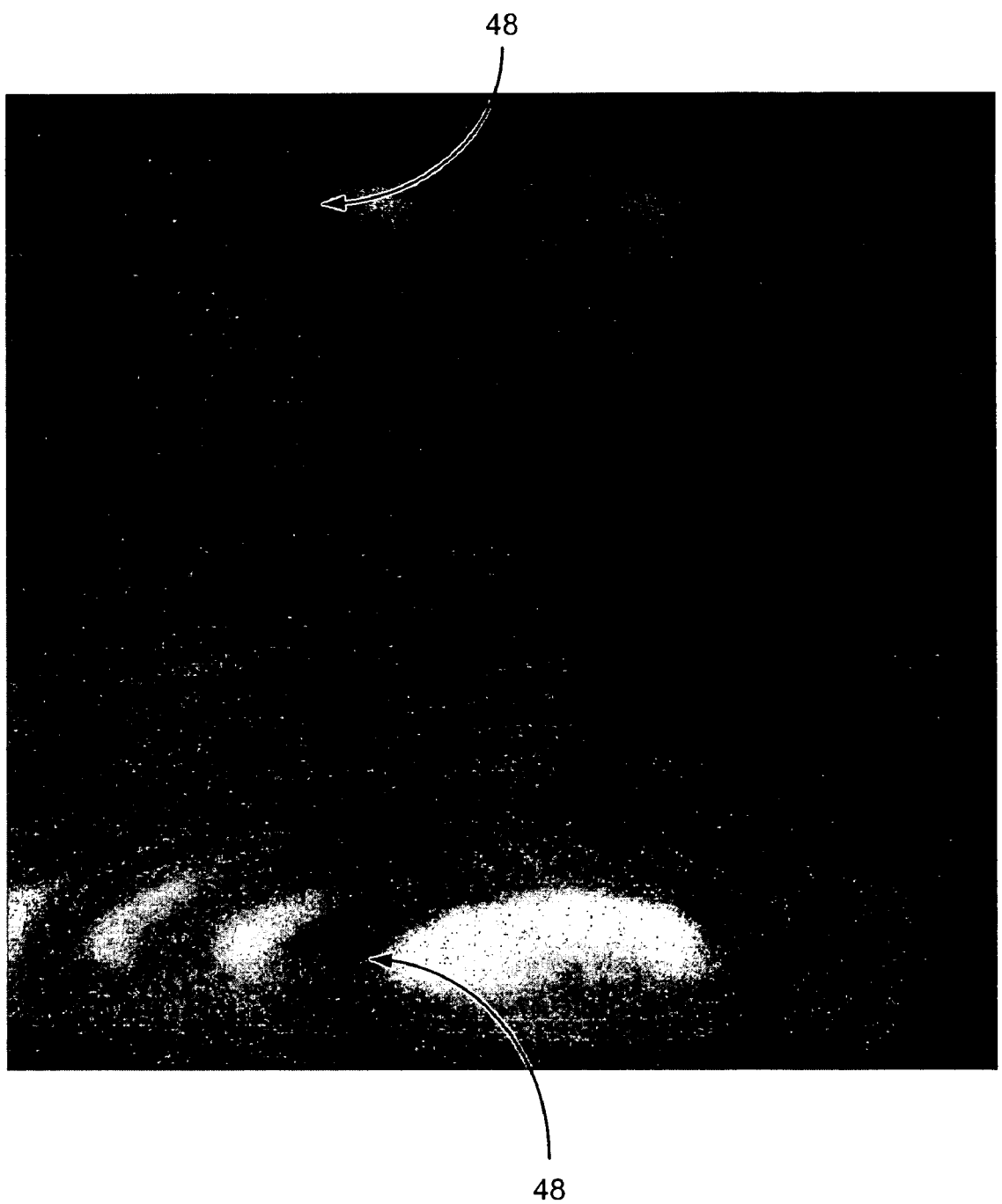
FIG. 5 is a representative image of interference fringes generated and detected for charged particle beam endpointing, in accordance with aspects of the present invention.

FIG. 5 is a representative image of interference fringes. In the image, the fringes 48 are identified by the darker areas. There are fringes present for each wavelength period of separation between the surface and the underlying surface. As such, the pattern, separation, and number of fringes reflects the spatial relationship between the trench floor surface and the underlying features. In the example of forming a trench and using 500 nm wavelength light, there is a fringe present for any difference of 500 nm between the trench floor and the underlying structure. Thus, for example, if one fringe represents 5000 nm separation between the trench floor and the underlying structure, then an adjacent fringe either represents 4500 nm or 5500 nm separation.

In one embodiment, an opaque enclosure 46 is employed throughout the endpointing and imaging paths of the optical coupling apparatus 22 to protect the paths from ambient light, particulate matter, and other contaminants that may adversely affect the various components of optical coupling apparatus 22, or the illuminating, imaging and endpointing beams.

Figure 6:
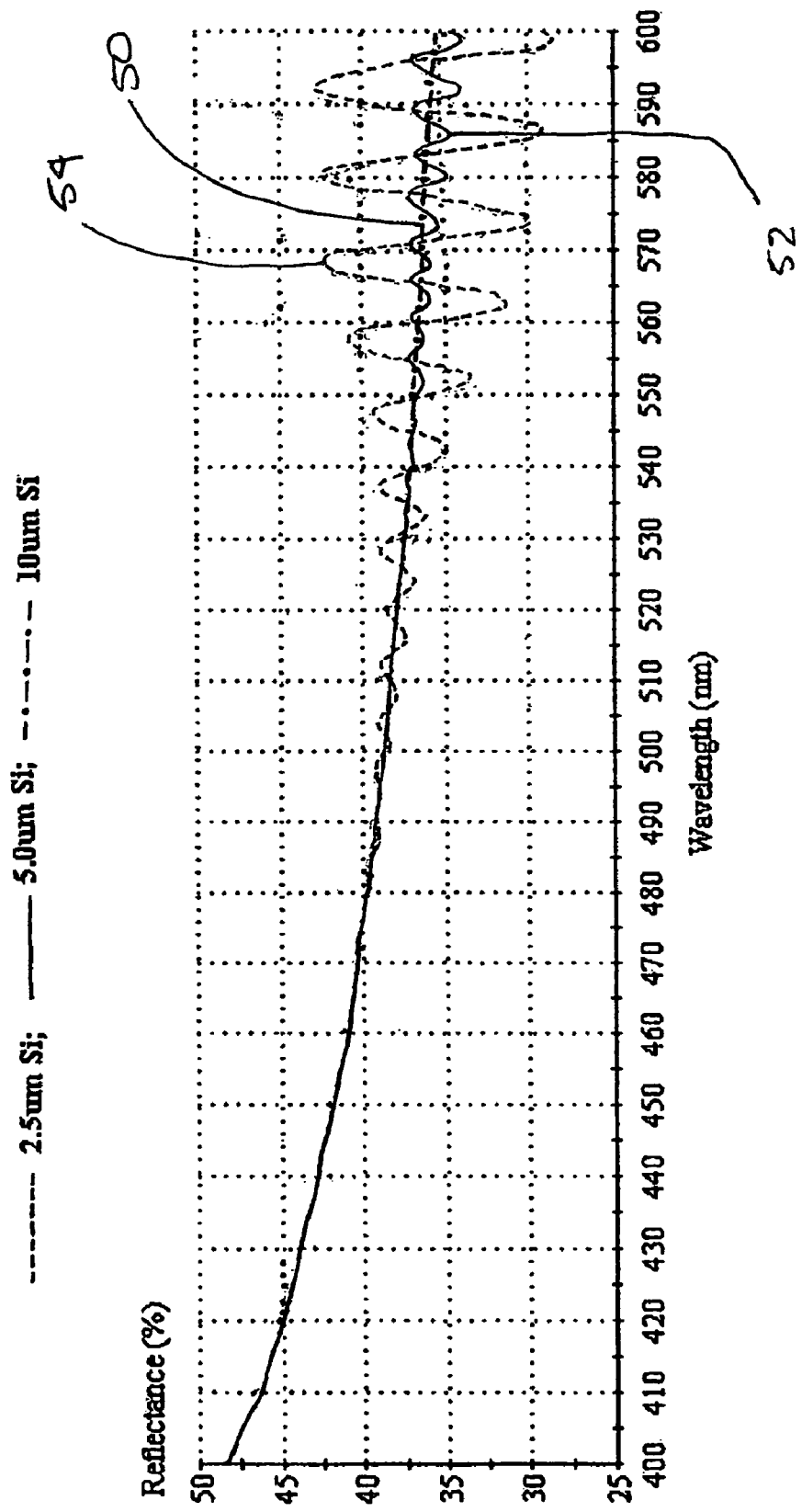
FIG. 6 is a graph illustrating reflectance characteristics for various wavelengths of light at a 2.5 micrometer trench floor thickness, 5 micrometer trench floor thickness, and 10 micrometer trench floor thickness

FIG. 6 is a graph illustrating the reflectance characteristics of certain wavelengths of light at certain trench floor thicknesses, namely 2.5 μm silicon trench floor thickness 54, 5.0 μm silicon trench floor thickness 52, and 10 μm silicon trench floor thickness 50. The graph illustrates the reflectance characteristics exhibited at boundaries between air, silicon and silicon oxide portions of the integrated circuit. As used herein, the phrase "trench floor thickness" refers to the thickness of the remaining silicon substrate in the floor of a milled trench. The silicon substrate floor separates the trench from the underlying circuit structures formed in the silicon oxide portion of the IC. The trench, trench floor, circuit structures, and the like are discussed in greater detail below with respect to FIGS. 7-12.

The graph illustrates that with a 500-600 nanometer wavelength light, little interference fringes are generated when the trench has approximately a 10 μm silicon trench floor thickness. Interference fringes become more visible at about 5 μm floor thickness and interference fringes become quite distinct at about 2.5 μm silicon floor thickness. In one implementation, 500 μm white light is chosen so that fringes appear at about 2.5 µm floor thickness. Other wavelengths may be chosen for other desired floor thicknesses. Thus, by detecting the amplitude and/or intensity of interference fringes, one viewing an image of the trench can begin to faintly detect interference fringes at approximately 2.5 µm of remaining silicon. In many cases, well structures, such as n-wells, are as deep as about 4 µm in the substrate, below the circuit structures. As such, at the 2.5 µm depth of remaining silicon, the milling procedure will have begun to enter into the n-well regions of the underlying circuit structures. Note, in the drawings of FIGS. 7-9 and 11-12, the backside surface of substrate is shown at the top of the drawings. Different light wavelengths and filter bandwidths may be chosen to cause the appearance of interference fringes depending on the material thickness, the material types targeted, etc. Moreover, as shown in the graph, by adjusting the wavelength of light, it is possible to adjust at what trench floor thickness fringes will appear. Generally, by increasing wavelength, fringes will appear at increasing floor thickness. As will be discussed in further detail below, further imaging preparation can be performed with the exposed wells to image and identify the circuit structures immediately below the trench floor.

Figure 7:
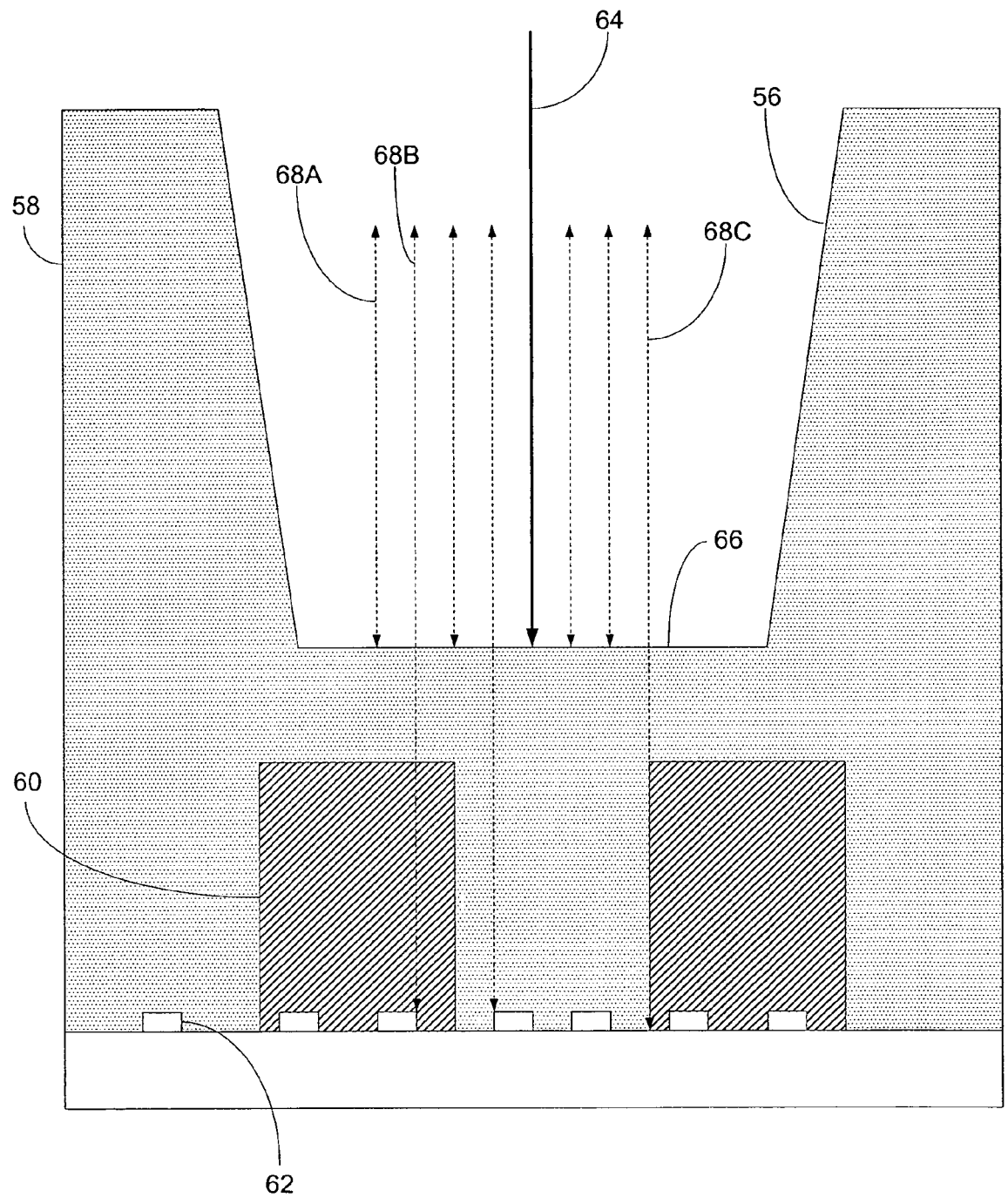
FIG. 7 is a representative section view of a charged particle beam milled trench in the substrate of a semiconductor integrated circuit.

FIGS. 7-12 illustrate various examples of a trench 56 formed in the silicon substrate 58 of an integrated circuit. FIGS. 7-12 further illustrate underlying n-wells 60, metal interconnects 62 and other features forming various layers and functional structures of an IC. Referring first to FIG. 7, a trench 56 is shown milled into the silicon substrate 58 of an integrated circuit. As mentioned above, a focused ion beam 64 is used to mill the trench. The focused ion beam may be moved from point to point in a raster pattern along a floor 66 of the trench. Light 68 is directed into the trench from the optical assembly 22 and follows the light path F. In the example of FIG. 7, there is approximately 3 µm of remaining silicon between a floor of the trench and the circuit structure (a 3 µm trench floor thickness). As such, some light (68A) is reflected from the floor of the trench. Additionally, some of the light (68B, 68C) passes through the silicon and is reflected off the underlying circuit structure. Reflections off the underlying metal dominates reflection variations between p and n dopant variations. The light reflected from the trench floor and the light reflected from the underlying circuit generates interference fringes as discussed above. The reflected light, whether it's from the floor of the trench or from the underlying circuit travels up the optical path and is received by the imaging electronics. As such, with a 3 µm silicon trench floor thickness, a user will see interference fringe effects. From the presence of interference fringes, the FIB user understands that the trench is approaching the underlying circuit structure, and may stop milling at any time.

Figure 8:
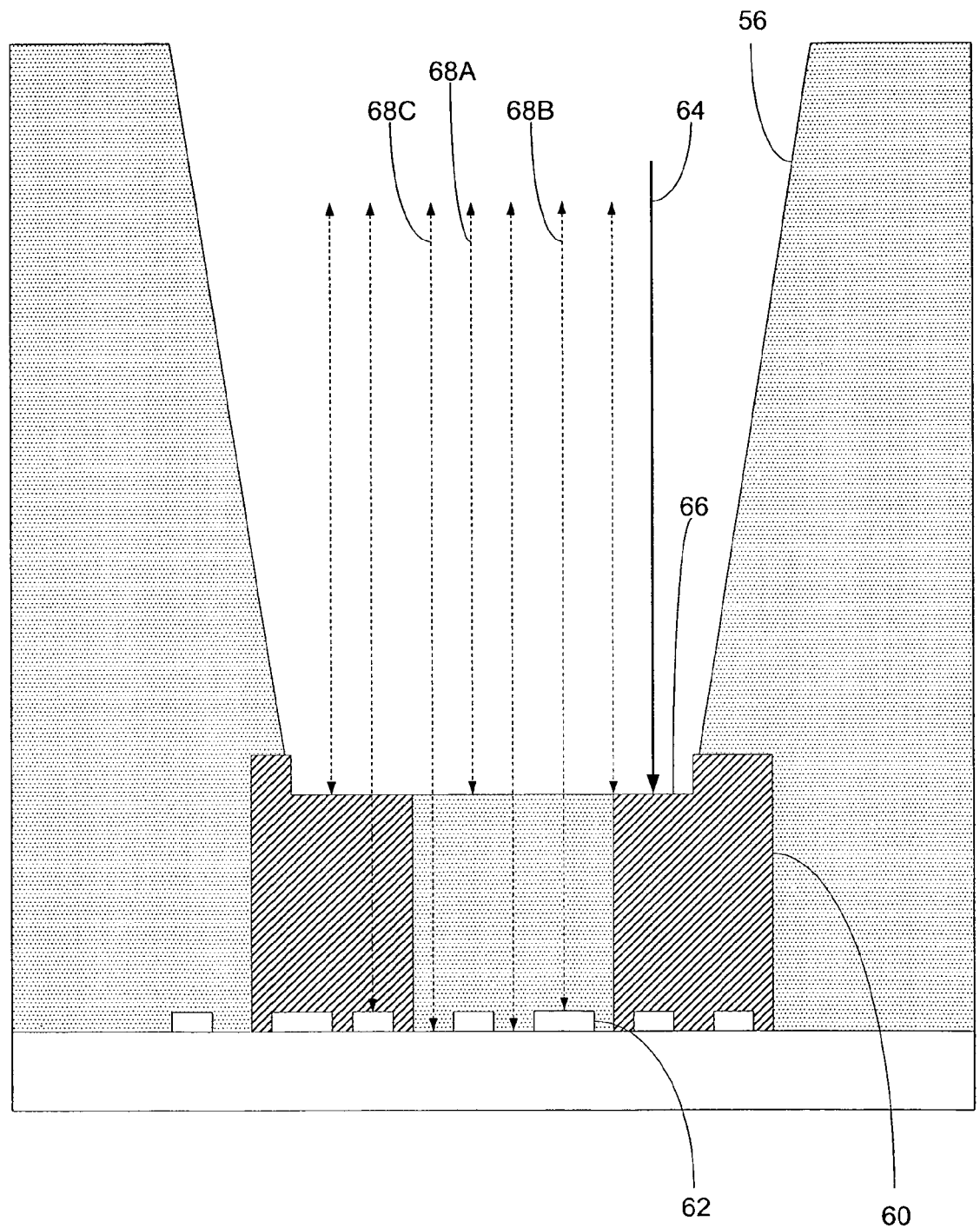
FIG. 8 is a representative section view of a charged particle beam milled trench in the substrate of a semiconductor integrated circuit of FIG. 7, with the milling operation within the n-wells of various circuit structures.

Referring now to FIG. 8, the trench 56 has been further milled by the FIB 64, and the floor 66 has approximately a 2.5 3 µm floor thickness. As such, interference fringe effects are becoming more intense and the user may decide to stop the milling procedure due to the intensity of the interference fringes. As can be seen from FIG. 8, the FIB trench has now begun to penetrate into the n-wells 60 of the circuit structures. P-diffusion regions may also be seen in the substrate and in the n-wells.

Figure 9:
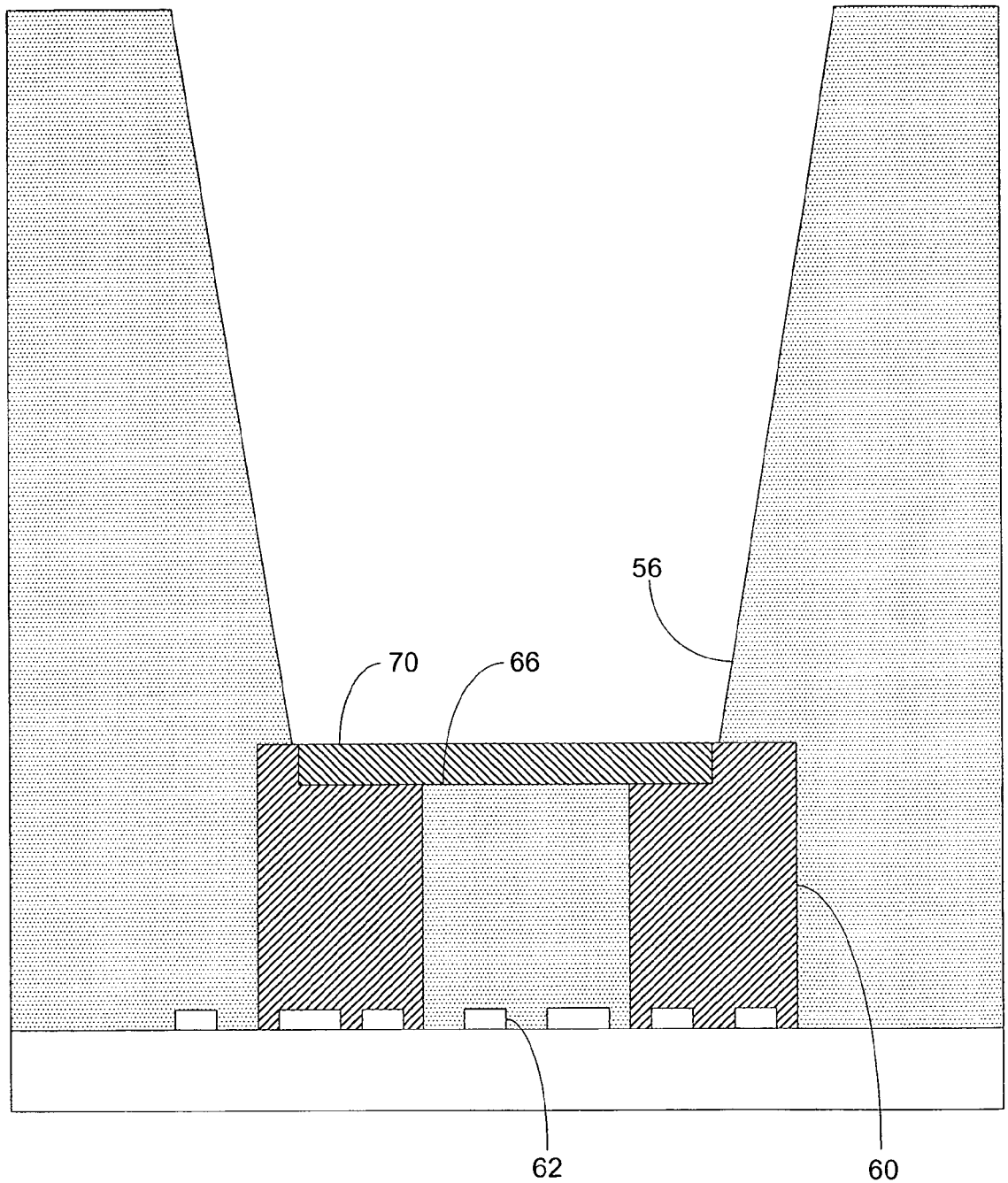
FIG. 9 is a representative section view of a charged particle beam milled trench in the substrate of a semiconductor integrated circuit of FIG. 8, with an oxide layer deposited on the floor of the trench for purposes of voltage contrast imaging, in accordance with aspects of the present invention.

FIG. 9 illustrates a FIB trench 56 with a thin deposition of oxide film 70, such as 130 nanometers (nm), on the floor 66 of the trench. In accordance with the teachings of U.S. Pat. No. 6,958,248, referenced above, enhanced imaging of the circuit structure, particularly n-wells, can be facilitated through the deposition of oxide and the employment of focused ion beam secondary electron imaging. In such a procedure, the focused ion beam is used to deposit oxide on the floor of the trench. The focused ion beam, at about 30 keV, is then trained upon the deposited oxide and secondary electrons are generated by the impact of the focused ion beam. Other processing steps such as removal of gallium ions implanted in the silicon, may be necessary for contrast imaging. In such a manner, the shape and contrast between n-wells in comparison to the surrounding substrate can be enhanced dramatically so that the user can image the n-wells and p-substrate from that information and obtain a precise understanding of the location and type of certain structures underlying the trench floor. With such information, a user may then perform additional circuit editing techniques such as milling a pinpoint hole to various metal layers and creating connections therebetween. It is possible to employ the fringe based endpointing and other techniques discussed herein in conjunction with the voltage contrast technique, However, the endpointing and other fringe based processing methods may be used alone and in various applications not related or involving the voltage contrast techniques.

Figure 10:
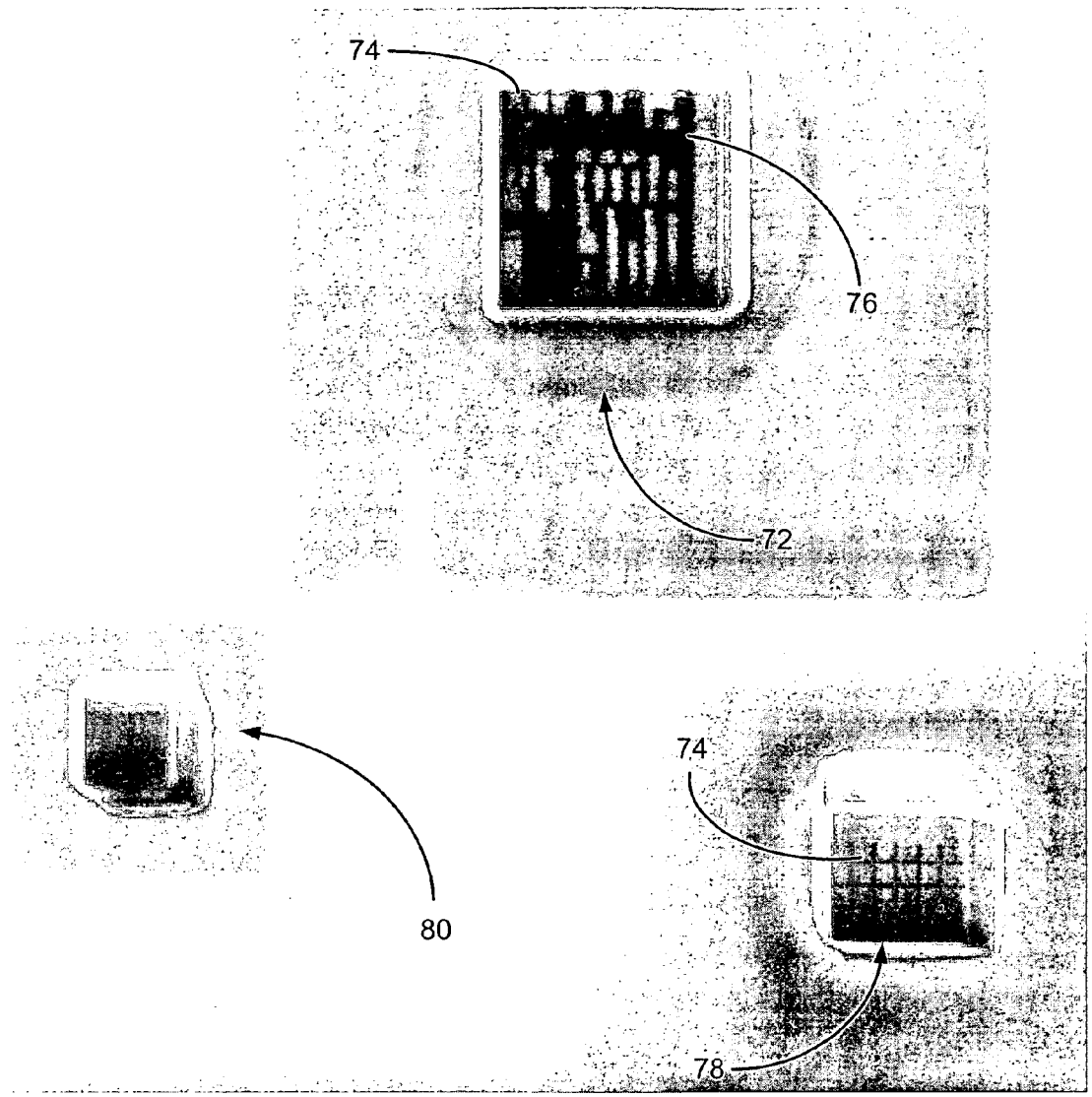
FIG. 10 illustrates three representative images of a 50×50 micrometer trench, a 30×30 micrometer trench, and a 20×20 micrometer trench, milled and processed in accordance with aspects of the present invention.

FIG. 10 illustrates images of circuit configurations revealed by forming relatively small trenches in an IC substrate. The top trench 72 is about 50 µm×50 µm, and was milled to about 2-3 µm floor thickness using the interference fringe endpointing technique described herein. The floor was then coated with an oxide film and voltage contrast imaging performed. The relatively light structures 74 are n-wells, and the dark area 76 is p-substrate. The bottom right trench 78 is 30 µm×30 µm, and was milled to about 2 µm floor thickness using the interference fringe endpointing technique described herein. With the voltage contrast technique, n-wells 74 surrounding in a substrate grid pattern are clearly shown. Finally, the bottom left trench 80 is 20 µm×20 µm and was milled to a floor thickness of about 2-3 µm using the interference fringe endpointing technique described herein. N-wells may also be seen in the trench. As mentioned above, voltage contrasting techniques can be used for endpointing. However, as the size of the trench floor is decreased to, or below, 50 µm×50 µm existing endpointing techniques are insufficient. The interference fringe endpointing technique, according to aspects of the present invention, may be used to perform endpointing in trenches that are 50 µm×50 µm and less, as well as larger trenches.

Figure 11:
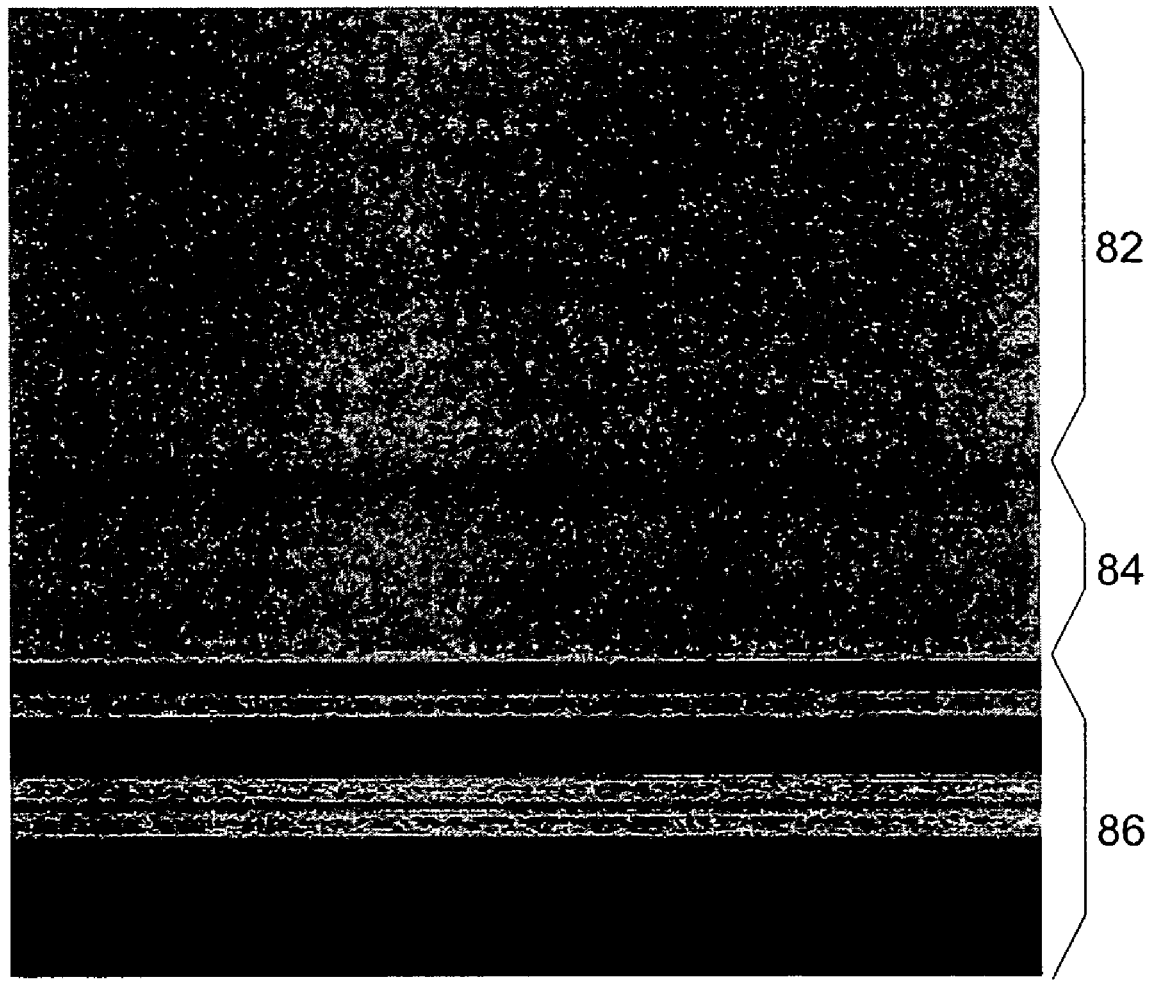
FIG. 11 is a representative image of a small portion of a trench having about a 2.3 micrometer floor thickness, milled in accordance with aspects of the present invention.

FIG. 11 is a close-up section view of a trench 82, floor 84, and underlying circuit structure 86, tilted 45°. In this example, the floor thickness was milled to about 2.3 µm using the interference endpointing technique of the present invention.

Figure 12:
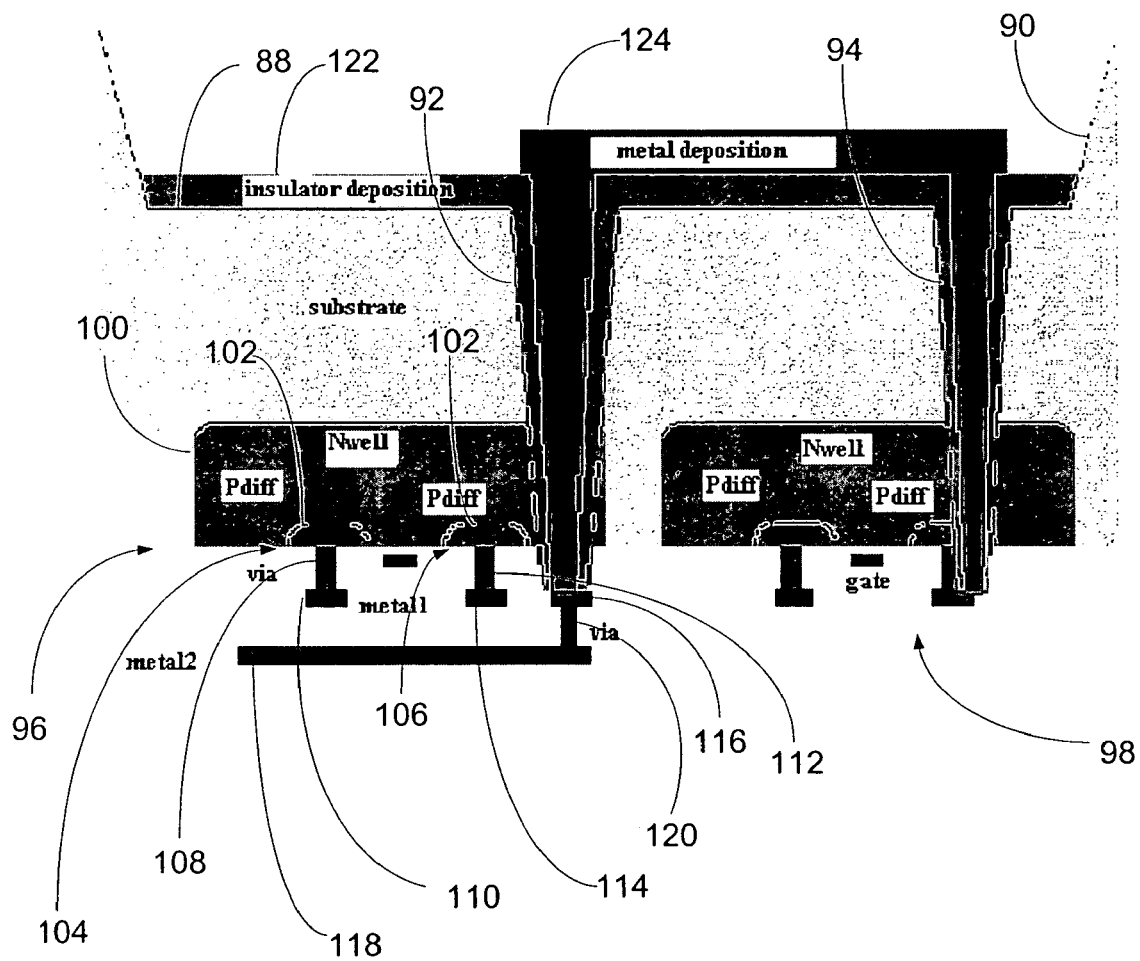
FIG. 12 is a representative section view of a semiconductor integrated circuit processed in accordance with various aspects of the present invention.

FIG. 12 is a representative section view of a circuit edit procedure performed from the floor 88 of a trench 90 milled in accordance with interference fringe techniques of the present invention. From the floor of the main trench 90, the user has milled two additional trenches (92, 94) to a depth below the n-wells of various underlying circuit structures. Through the voltage contrasting techniques described above or other methods and as illustrated in FIG. 9, the FIB user is able to clearly see the boundaries between the n-wells and the surrounding substrates. In this example, a left transistor configuration 96 and a right transistor configuration 98 are shown. The left transistor configuration comprises an n-well 100 with two p-diffusion regions 102. A drain 104 is formed at one p-diffusion and the source 106 is formed at the other p-diffusion. A first via 108 forms a contact between the drain and a metal 1 trace 110, and a second via 112 forms a contact between the source and a metal 1 trace 114. An additional metal 1 trace 116 is connected to metal 2 118 at a third via 120. The right transistor configuration includes a similar configuration with n-well and two p-diffusion regions, gate, drain and source, and vias forming connection to metal 1.

Precise positioning of the focused ion beam through generation of a voltage contrast image or through other imaging or FIB placement methods, facilitates the precise hole 92 milled through the trench floor to the metal 1 trace adjacent the left transistor. Further, a second precise hole 94 is drilled to the source contact of the right transistor. The relatively smaller dimension holes (trenches (92, 94) may be milled in accordance with endpointing techniques set forth herein. Insulator 122 is deposited along the trench floor and each precisely milled hole. To form an electrical contact, conductor 124 is deposited between the right hole and the left hole, over the deposited insulator. The deposition of the conductor creates a contact between the right and left transistors that did not exist before. In this way a user may test a circuit correction without refabricating the entire IC.

Figure 13A:
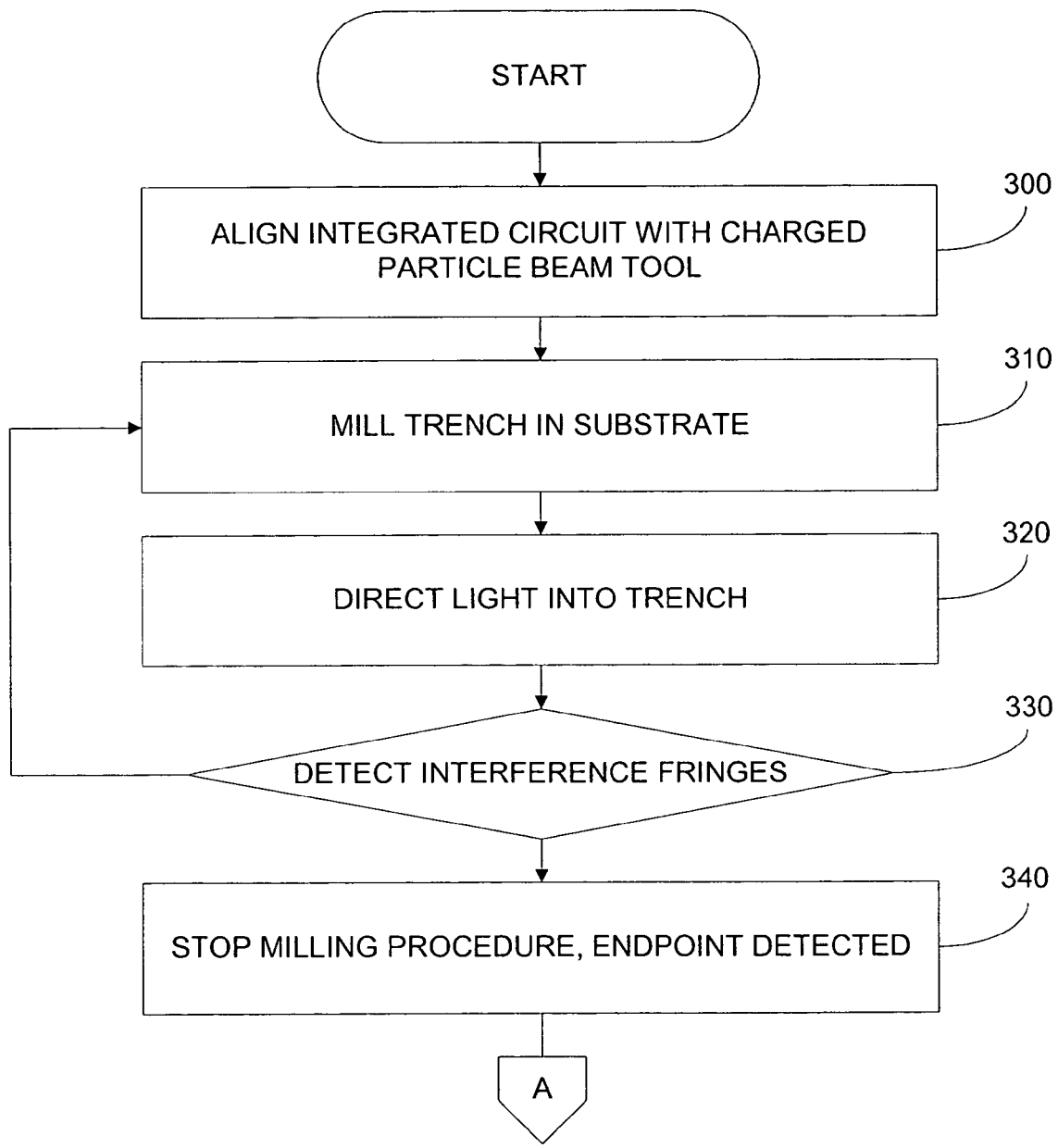
FIGS. 13A and 13B are a flowchart illustrating a method for charged particle beam endpointing through generation and detection of optical interference fringes and trench processing for enhanced imaging, in accordance with aspects of the present invention.
Figure 13B:
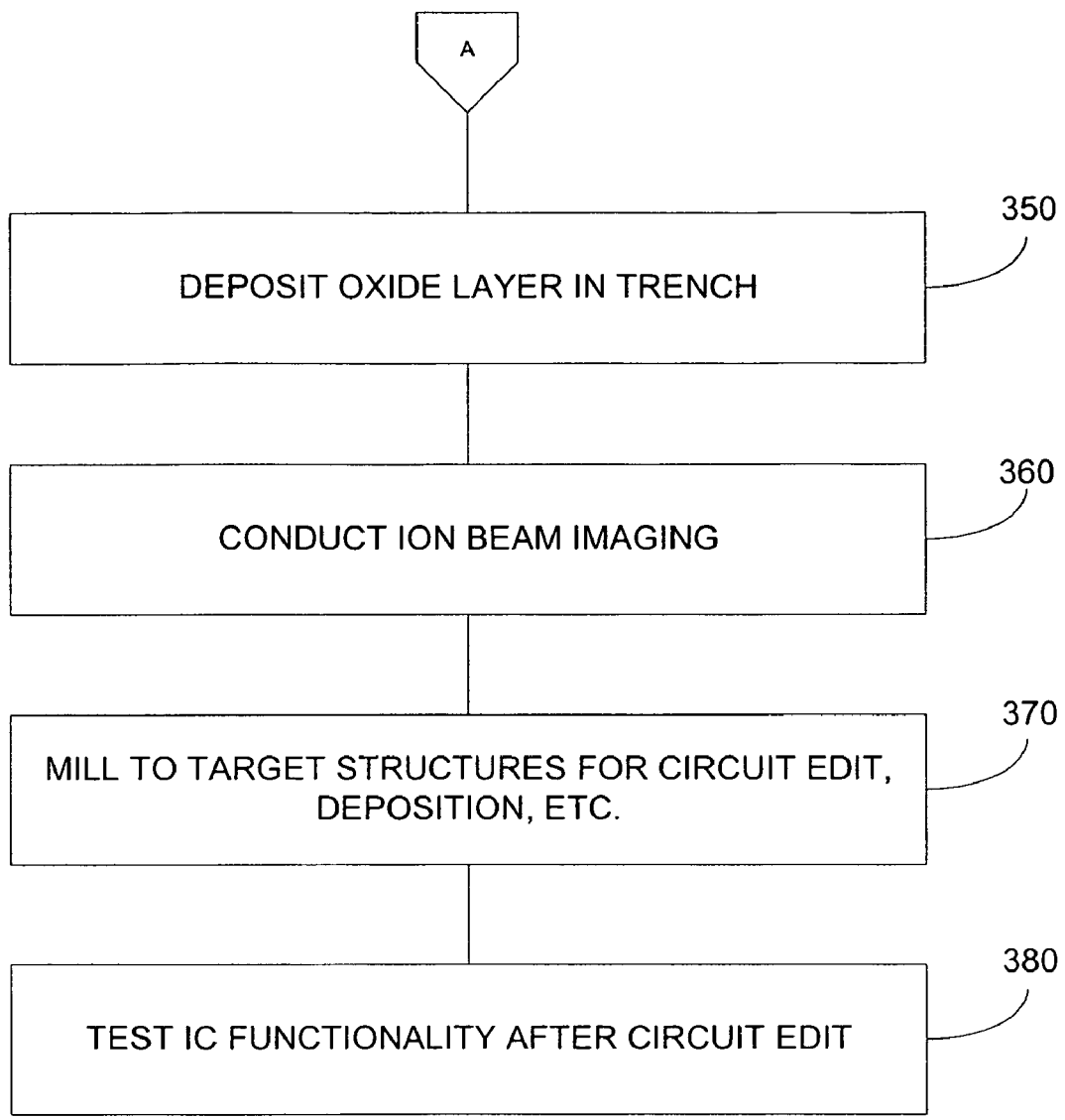

FIGS. 13A and 13B illustrate a flowchart of various operations that may be performed in accordance with aspects of the present invention. Referring first to FIG. 13A, in any milling or charged particle beam operation, it is appropriate to first align the target integrated circuit with the charged particle beam tool (operation 300). In many cases this involves an understanding of the location of a target underlying circuit configuration with respect to the outer boundaries of the IC package. Such alignment may be performed through imaging, computer-aided-design information about the IC, and other methods. The focused ion beam is precisely aligned with the desired incident location of the IC and the milling is begun (operation 310). In one particular example, FIB milling occurs at 30 keV with a beam current density of 10 pA/$\mu m^2$ in the presence of $XeF_2$. As mentioned above, during the milling operation light is directed into the trench (operation 320). The light is directed at particular target wavelengths, such as 500 nanometer wavelength with a 70 nm bandwidth filter, depending on the silicon doping concentration. For silicon with high doping concentration, a filter with a bandwidth of less than 70 nm may be appropriate for better fringe contrast. The milling operation is continued until the detection of interference fringes (operation 330). Upon the detection of interference fringes, the milling procedure is stopped as the endpoint has been detected (operation 340). For trenches greater than 50 $\mu m \times 50$ $\mu m$, FIB milling at 15 keV 24 4 nA/$\mu m^2$ in the presence of $XeF_2$ may be preferred. As mentioned above, at various intensities of interference fringes, the user may decide to stop the milling operation. As such, milling may continue after the first detection of interference fringes as the depth of the trench may not yet be appropriate. Such a case is when it is desired to perform voltage contrast imaging, which is best done when the trench is deep enough that it has begun to impinge on the underlying n-wells (i.e. within the p-n junction).

Referring now to FIG. 13B, before a voltage contrast imaging operation, oxide is deposited in a thin layer on the floor of the trench (operation 350). Then, ion beam imaging is conducted (operation 360). One method for ion beam imaging and secondary electron detection and imaging is discussed in co-pending application Ser. No. 10/887,800 titled "Charged Particle Guide" filed on Jul. 9, 2004, which is hereby incorporated by reference herein. After ion beam imaging is performed the user may direct the focused ion beam to perform precise holes in the trench floor down to exact target circuit structures (operation 370). The depth of the secondary trenches (precise holes) may be controlled using techniques set forth herein. The milling may be done for purposes of cutting metal layers, and/or depositing conductors so as to create connections that previously were not present. After the circuit editing is performed, the IC is tested for functionality using any appropriate automatic testing equipment (operation 380).

While the disclosed embodiments are described in specific terms, other embodiments encompassing principles of the invention are also possible. Further, operations may be set forth in a particular order. The order, however, is but one example of the way that operations may be provided. Operations may be rearranged, modified, or eliminated in any particular implementation while still conforming to aspects of the invention. Embodiments within the scope of the present invention also include computer readable media for carrying or having computer-executable instructions or data structures stored thereon. Such computer-readable media may be any available media that can be accessed by a general purpose or special purpose computer. By way of example, and not limitation, such computer-readable media can comprise RAM, ROM, EEPROM, DVD, CD ROM or other optical disk storage, magnetic disk storage or other magnetic storage devices, or any other medium which can be used to carry or store desired program code means in the form of computer-executable instructions or data structures and which can be accessed by a general purpose or special purpose computer. A focused ion beam tool, electron beam tool, and other various integrated circuit processing tools set forth herein may be viewed as special purpose computers. When information is transferred or provided over a network or another communications link or connection (either hardwired, wireless, or a combination of hardwired or wireless) to a computer, the computer properly views the connection as a computer-readable medium. Thus, any such a connection is properly termed a computer-readable medium. Combinations of the above should also be included within the scope of computer-readable media. Computer-executable instructions comprise, for example, instructions and data which cause a general purpose computer, special purpose computer, or special purpose processing device to perform a certain function or group of functions.

All directional references (e.g., upper, lower, upward, downward, left, right, leftward, rightward, top, bottom, above, below, etc. are only used for identification purposes to aid the reader's understanding of the embodiments of the present invention, and do not create limitations, particularly as to the position, orientation, or use of the invention unless specifically set forth in the claims. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other.

In some instances, components are described with reference to "ends" having a particular characteristic and/or being connected to another part. However, those skilled in the art will recognize that the present invention is not limited to components which terminate immediately beyond their points of connection with other parts. Thus, the term "end" should be interpreted broadly, in a manner that includes areas adjacent, rearward, forward of, or otherwise near the terminus of a particular element, link, component, member or the like. It is intended that all matter contained in the above description or shown in the accompanying drawings shall be interpreted as illustrative only and not limiting. Changes in detail or structure may be made without departing from the spirit of the invention as defined in the appended claims.

We claim:

1. A method for processing an integrated circuit comprising:
   directing white light to a target portion of the integrated circuit, wherein the target portion of the integrated circuit has a first side of a substrate on which the white light is shone, and at least one circuit structure formed into and on a second side of the substrate opposite to the first side;
   receiving reflected light from the target portion of the integrated circuit;
   detecting interference fringes from the reflected light, wherein the interference fringes are formed by light reflected from the substrate and light reflected from the at least one circuit structure; and
   processing the integrated circuit in response to the interference fringes.

2. The method of claim 1 wherein the operation of processing is selected from the group comprising: charged particle beam processing, laser etching, chemical etching, mechanical milling, lapping, polishing, and chemical mechanical polishing.

3. The method of claim 1 wherein the operation of detecting further comprises identifying at least one characteristic of the interference fringes.

4. The method of claim 3 wherein the at least one characteristic is selected from the group comprising: spacing of interference fringe bands, brightness of interference fringe bands, number of interference bands, and pattern of interference bands.

5. The method of claim 1 wherein the operation of processing further includes forming a trench.

6. The method of claim 5 wherein the operation of forming a trench further includes stopping the formation of the trench as a function of the detection of the interference fringes.

7. The method of claim 6 further comprises stopping the formation of the trench as a function of at least one particular characteristic of the interference fringes.

8. A method for conducting a charged particle beam operation on an integrated circuit comprising:
   directing a charged particle beam on a target region of an integrated circuit, wherein the target region of the integrated circuit has a first side of a substrate on which the charged particle beam is focused, and at least one circuit structure formed into and on a second side of the substrate opposite to the first side;
   directing light on the target region of the integrated circuit;
   receiving reflected light from the target region of the integrated circuit;
   detecting interference fringes from the reflected light, wherein the interference fringes are formed by light reflected from the substrate and light reflected from the at least one circuit structure; and
   controlling the charged particle beam as a function of the detection of interference fringes from the reflected light.

9. The method of claim 8 wherein the charged particle beam is a focused ion beam.

10. The method of claim 8 wherein the charged particle beam is an electron beam.

11. The method of claim 8 wherein the target region of the integrated circuit is a silicon substrate portion of the integrated circuit.

12. The method of claim 8 wherein the light directed unto the target region of the integrated circuit has about 500 nanometer wavelength.

13. The method of claim 8 wherein the light is generated from a light source selected from the group comprising: a filament light source, a laser, and a light emitting diode.

14. The method of claim 8 wherein some of the reflected light is reflected from a silicon portion of the integrated circuit and some of the reflected light is reflected from a silicon oxide portion of the integrated circuit.

15. The method of claim 8 wherein the operation of controlling further comprises stopping the charged particle beam as a function of the detection of constructive interference type fringes.

16. The method of claim 8 wherein the operation of controlling further comprises stopping the charged particle beam as function of the detection of destructive interference type fringes.

17. The method of claim 8 wherein the operation of directing a charged particle beam unto a target region of an integrated circuit comprises the operation of milling a trench in a semiconductor substrate of the integrated circuit.

18. The method of claim 17 further comprising the operations of: depositing an oxide layer on a floor of the trench; performing voltage contrast imaging to display a contrast between well structures and substrate structures.

19. The method of claim 17 wherein the trench is less than 50 micrometer ×50 micrometer in dimension.

20. The method of claim 17 wherein the substrate is less than 5 micrometers thickness.

21. The method of claim 8, wherein the method of directing light comprises enclosing a substantial portion of an illuminating and imaging optical path by a charged particle beam column that focuses the charged particle beam onto the target region.

22. A charged particle beam tool comprising:
   a charged particle beam column adapted to direct a charged particle beam along a beam path to a target portion an integrated circuit, wherein the target portion of the integrated circuit has a first side of a substrate on which the charged particle beam is focused, and at least one circuit structure formed into and on a second side of the substrate opposite to the first side;
   an imaging assembly adapted to guide light along a light path to the integrated circuit, the light path substantially coaxial with the beam path at the integrated circuit;
   a filtering assembly in the light path, the filtering assembly adapted to select light wavelength suitable for interference fringe endpointing; and
   an imaging platform adapted to receive light reflected from the integrated circuit and display interference fringes, wherein the interference fringes are formed by light reflected from the substrate and light reflected from the at least one circuit structure.

23. The charged particle beam tool of claim 22 wherein the charged particle beam column comprises a focused ion beam column.

24. The charged particle beam tool of claim 22 wherein the charged particle beam column comprises an electron beam column.

25. The charged particle beam tool of claim 22, wherein the charged particle beam tool further comprises means for precisely aligning the charged particle beam to the target portion of the integrated circuit.

26. The charged particle beam tool of claim 22, wherein a substantial portion of an illuminating and imaging optical path is enclosed by the charged particle beam column.

* * * * *